(12) United States Patent
Lee

(10) Patent No.: US 7,376,590 B2
(45) Date of Patent: May 20, 2008

(54) UNION REMOTE CONTROLLER, UNION REMOTE CONTROLLER INFORMATION PROVIDING SYSTEM AND METHOD FOR USING THE SAME

(75) Inventor: Jae Kyung Lee, Taegu-shi (KR)

(73) Assignee: LG Electronics Inc., Seoul (KR)

( * ) Notice: Subject to any disclaimer, the term of this patent is extended or adjusted under 35 U.S.C. 154(b) by 644 days.

(21) Appl. No.: 10/023,746

(22) Filed: Dec. 21, 2001

(65) Prior Publication Data

US 2002/0120718 A1   Aug. 29, 2002

(30) Foreign Application Priority Data

Dec. 21, 2000   (KR) ............................. 2000-79647

(51) Int. Cl.
*G06Q 30/00* (2006.01)
(52) U.S. Cl. .......................................... 705/26; 705/27
(58) Field of Classification Search ................. 705/26
See application file for complete search history.

(56) References Cited

U.S. PATENT DOCUMENTS 6,437,836 B1 *   8/2002   Huang et al. ............... 348/734
6,791,467 B1 *   9/2004   Ben-Ze'ev ............. 340/825.69
6,909,378 B1 *   6/2005   Lambrechts et al. ... 340/825.22

OTHER PUBLICATIONS

Standards on the box: Berlin Fair Round-Up: The Multimedia Home Platform aims to create TV set-top boxes that accept digital programmes from a wide range of sources; [London edition], Cole, George. Financial Times. London (UK): Sep. 7, 1999. p. 14.*

* cited by examiner

*Primary Examiner*—James Zurita
(74) *Attorney, Agent, or Firm*—Ked & Associates LLP

(57) ABSTRACT

A remote controller, a remote controller information providing system, and a method for operating the same are disclosed, whereby controller information for various electronic apparatuses are upgraded just by downloading simple remote controller information regardless of an electronic apparatus, kinds, manufacture companies, model names, and availability in the market. The system includes a data base for storing remote controller information to various manufacture companies, kinds, and models; and a server for operating an Internet site which obtains remote controller information provided from manufacture companies of each electronic apparatus, stores them in a data base, and provides remote controller information according to a user's request. Multiple electronic apparatuses are controlled with one remote controller. Products which will become available later is controllable by simply downloading data. No temporal and economical inconvenience exist for a user to maintain a number of remote controllers.

10 Claims, 4 Drawing Sheets

UNION REMOTE CONTROLLER, UNION REMOTE CONTROLLER INFORMATION PROVIDING SYSTEM AND METHOD FOR USING THE SAME

This application claims the benefit of the Korean Application No. P2000-79647 filed on Dec. 21, 2000, which is hereby incorporated by reference.

BACKGROUND OF THE INVENTION

1. Field of the Invention

The present invention relates to a union remote controller, and more particularly, to a union remote controller and a union remote controller information providing system and a method for using the same.

2. Discussion of the Related Art

Generally, a remote controller is an apparatus which converts an operator's commands into. an infrared ray signal of a predetermined code form and transmits the signal, so that an infrared ray receiving terminal of a corresponding electronic apparatus receives and controls the infrared ray signal. At this time, electronic apparatuses have different code systems according to manufacture companies and product models, etc. Also, the electronic apparatuses have different codes according to their function even in case of the same product. Accordingly, electronic apparatuses require different remote controllers according to manufacture companies and product models.

TABLE 1

| Code | Manufacture companies |
|---|---|
| NEC | Samsung/LG/Daewoo . . . domestic companies and TOSHIBA |
| RC5 | Each company in Europe |
| ZENITH | ZENITH |
| MITSUBISH | MITSUBISH |
| . . . | . . . |

At this time, as shown in Table 1, it can be known that each of manufacture companies uses a different code system.

TABLE 2

| Head Pulse | Custom Code | Custom code | Data code | Data Code |
|---|---|---|---|---|

TABLE 3

| Contents of Key | Code (HEX) | Contents of Key | Code (HEX) |
|---|---|---|---|
| Power | 08 | Channel− | 01 |
| TV/Video | 0B | Volume+ | 02 |
| Multimedia | 98 | Volume− | 03 |
| Menu | 43 | Enter | 44 |
| Channel+ | 00 | APC | 4D |

As an example, the NEC code is constructed as shown in Table 2, and more particularly, a detailed remote controller code of the LG TV is constructed as a HEXA code as shown in Table 3.

Accordingly, the codes divided by manufacture companies and functions are converted into infrared rays through a transmitting means in a remote controller, that is, a light emitting diode (LED) when an operator presses a corresponding button of a remote controller, and then input to an infrared ray receiving terminal of a corresponding an electronic apparatus.

Subsequently, the infrared signal received in the infrared ray receiving terminal is decoded, and a microprocessor recognizes corresponding operation commands and controls a relevant structure, thereby performing an operation commanded by an operator.

However, since code systems are different from one another according to manufacture companies and models, separate remote controllers are provided to the corresponding products. In case of a general family, not a certain product but various electronic apparatuses from different manufacture companies are used. Also, at least three remote controllers are used because models and functions may be different from one another even in case of the same manufacture company.

To use multiple remote controllers correspondingly to products troubles a user, and it is also difficult to maintain the multiple remote controllers. Recently, even though union remote controllers for controlling some electronic products by unifying them are on the market, the union remote controllers have limited controlling scopes, thereby causing a problem in that they do not actively cope with codes which will be changed later.

SUMMARY OF THE INVENTION

Accordingly, the present invention is directed to a union remote controller and a union remote controller information providing system and a method for using the same that substantially obviates one or more problems due to limitations and disadvantages of the related art.

An object of the present invention is to provide a union remote controller and a remote controller information providing system and a method for using the same which controls various electronic apparatuses by simply downloading remote controller code information regardless of whether products have been on the market, kinds, manufacture companies, and model names.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a union remote controller includes a controlling unit having a display means, the controlling unit which is capable of performing a data communication through an Internet and which selects a function between a remote controller function and a telephone function; and an infrared ray transmitting means for transmitting an infrared ray signal according to the remote controller function.

In another aspect of the present invention, a union remote controller information providing system includes a data base for storing remote controller information correspondingly to manufacture companies and models; and a server for operating an Internet site which unifies various remote controller information, stores them in a data base, and provides remote controller information requested by a user.

In another aspect of the present invention, a method for using a union remote controller includes the steps of obtaining remote controller information corresponding to an electronic apparatus from a data base in case that a site is connected by a user and a request of remote controller information is accepted for remote controller information of a special electronic apparatus; and transmitting the obtained remote controller information to the corresponding user's terminal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
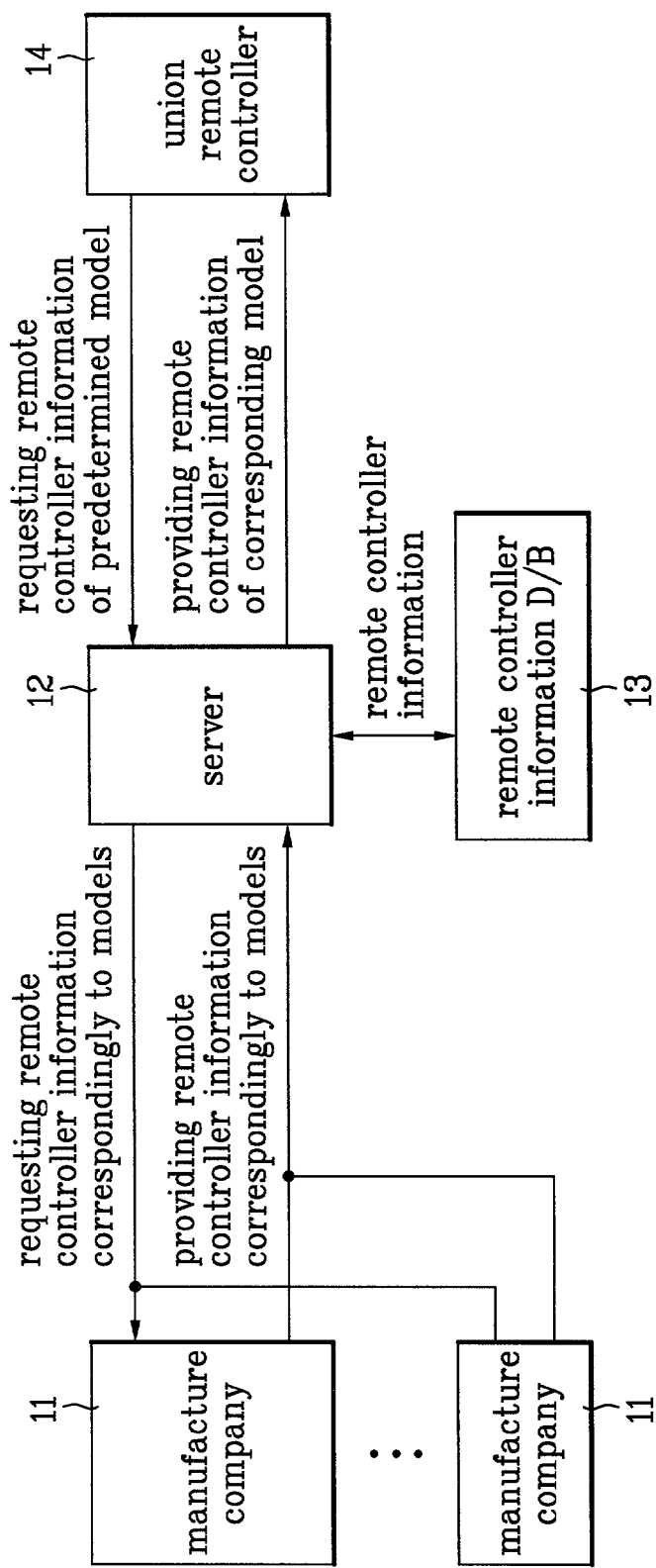
FIG. 1 illustrates a block diagram showing a construction of a union remote controller information providing system according to the present invention.

As shown in FIG. 1, a union remote controller information providing system according to the present invention includes each manufacture company 11 for requiring remote controller information of the manufacture company 11; a data base (D/B) for storing remote controller information provided from the corresponding manufacture company 11, such as code information for each manufacture company and model and text or graphic information for displaying each function, according to manufacture companies and models; and a server 12 for operating an Internet site which provides remote controller information required through a union remote controller 14 by a user.

At this time, the union remote controller 14 is realized by using a mobile communication terminal or a general remote controller which is one of the most widely used electronic apparatuses.

The mobile communication terminal has an Internet access function and a memory which downloads predetermined information through the Internet access function and stores the downloaded information. Accordingly, the mobile communication terminal can be used as a union remote controller just by adding a means which can transmit an infrared signal according to the various codes.

Figure 2:
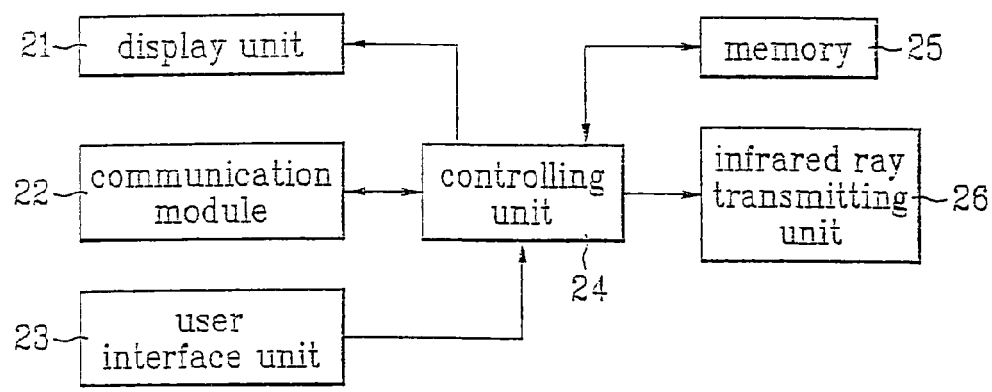
FIG. 2 illustrates a construction of a union remote controller using a mobile communication terminal according to the present invention.

FIG. 2 illustrates a construction of a union remote controller using a mobile communication terminal according to the present invention. A general mobile communication terminal includes a display unit 21 including a liquid crystal panel and a signal process structure for displaying an image in the liquid crystal panel; a communication module 22 for telephone communication and Internet communication; a user interface unit 23 including a key panel for a user's inputting telephone numbers and various operation commands; a memory 25; and a controlling unit 24 for controlling an operation of the aforementioned construction.

A union remote controller according to the preset invention is constructed by adding a program for selecting and controlling a remote controller function and a telephone function to the controlling unit 24 and by adding an infrared ray transmitting unit 26 for transmitting an infrared ray signal corresponding to a user's operation commands to the remote controller function.

Figure 3:
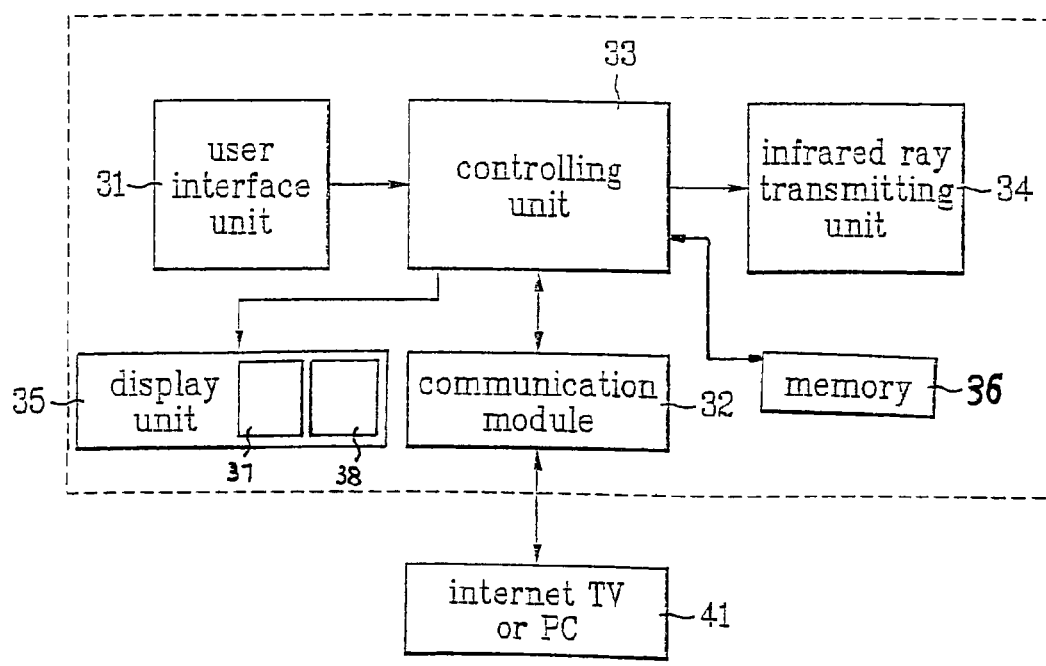
FIG. 3 illustrates a construction of a union remote controller using a general remote controller according to the present invention.

FIG. 3 illustrates a construction of a union remote controller using a general remote controller according to the present invention. In FIG. 3, remote controller information is downloaded by accessing an Internet TV or a PC.

General remote controller includes a user interface unit 31 including a key panel for inputting various function commands; a memory 36; an infrared transmitting unit 34 for transmitting an infrared signal; and a controlling unit 33 for controlling the infrared ray transmitting unit 34 so as to transmit an infrared ray signal corresponding to a user's operation command which is input through the user interface unit 31. A union remote controller according to the present invention is constructed by adding a communication module 32 for receiving remote controller information; a display unit 35 including an image process circuit 37 and a display window 38 such as an LCD for displaying image information about lists of an electronic apparatus and functions of a remote controller which a user wants to control; and a program for selecting and controlling the electronic apparatus.

At this time, the communication module 32 can not perform Internet access and data downloading by a remote controller itself. Accordingly, the communication module 32 is constructed to fit the communication standard of a PC or an Internet TV 41 which is commercially used in most of family.

Meanwhile, another embodiment of a union remote controller according to the present invention using a general remote controller further includes a display means, an Internet access means, and a communication means for data downloading to a general remote controller itself. Also, it further includes a program for controlling operations of the display, Internet access, and data downloading, thereby enabling direct downloading of remote controller information unlike the embodiment of FIG. 3.

Figure 4:
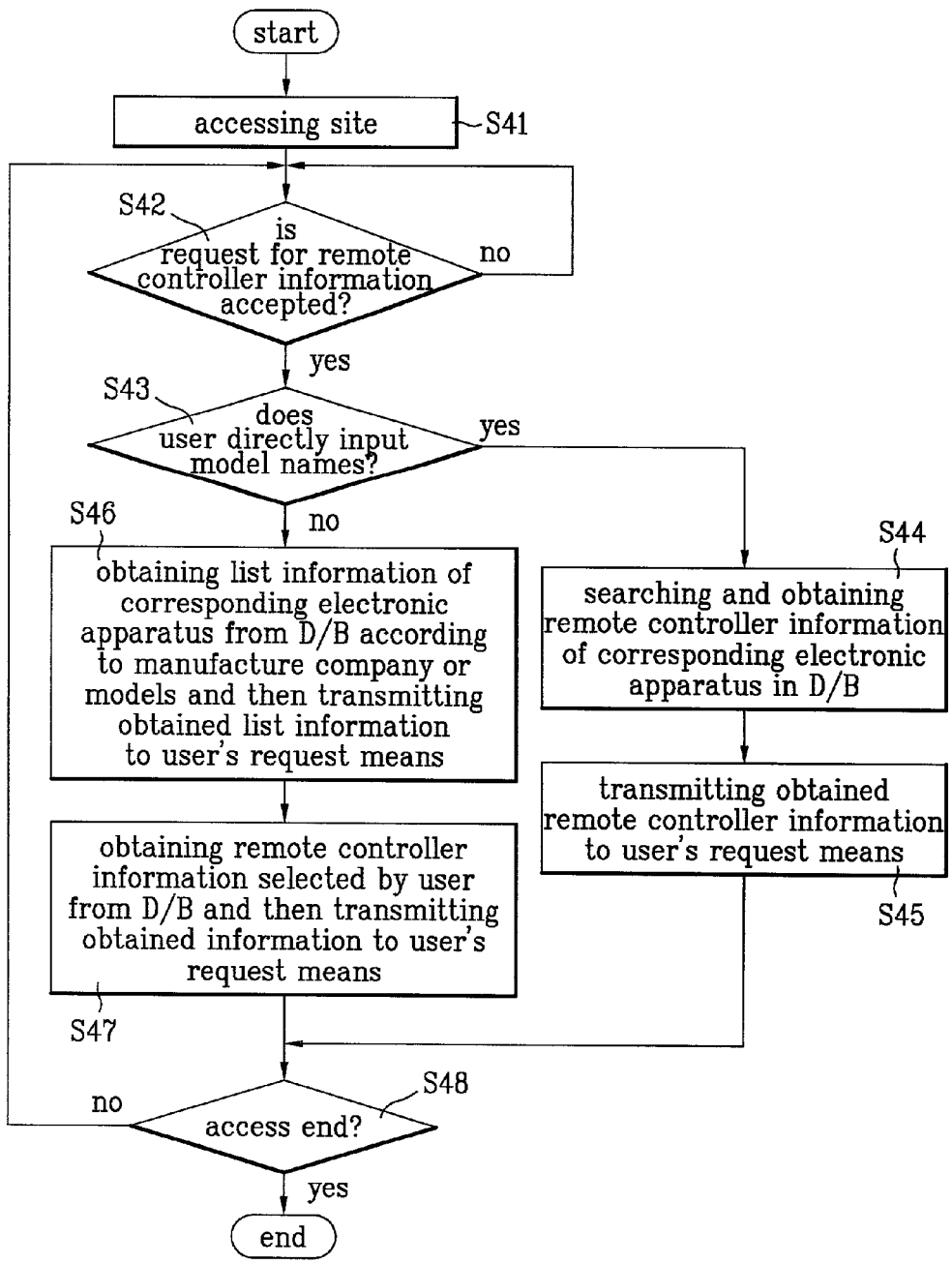
FIG. 4 illustrates a flow chart showing a method for operating a union remote controller information providing system according to the present invention.

A method for operating a union remote controller information providing system will be explained with reference to FIG. 4. A case based on a mobile communication terminal among examples of a union remote controller according to the present invention will be explained.

First of all, the server (or server operator) 12 of FIG. 1 collects various remote controller information (remote controller code information and function information of electronic apparatuses according to each kind and model) and list information of electronic apparatuses corresponding to the remote controller information. Then, the server stores the information in D/B, updates the D/B periodically, and operates an Internet site for providing remote controller information to a user.

Meanwhile, to download the remote controller information, a user accesses the Internet site by using his or her mobile communication terminal, thereby requesting remote controller information (S41).

Accordingly, the server 12 determines whether a request of remote controller information by a user accessed the Internet site is accepted or not (S42).

Subsequently, if the request of remote controller information is accepted as a result of the determination (S42), the server 12 determines whether the request of remote controller information is performed by a user's direct inputting a model name or not (S43).

Then, as a result of the determination (S43), if a user directly inputs a model name, the server 12 searches remote controller information matching to the model name which the user input to a D/B and obtains (S44).

Subsequently, the server 12 transmits the obtained remote controller information to a user's request means, that is a mobile communication terminal (S45).

Meanwhile, as a result of the determination (S43), if it is determined that the use didn't directly input a model name, the server 12 obtains a list of a corresponding electronic apparatus according to a manufacture company and a model in a D/B and transmits to a user's request means, that is a mobile communication terminal (S46). Accordingly, a user selects an electronic apparatus which he or she wants among lists displayed on his or her mobile communication terminal.

Then, the server 12 obtains remote controller information corresponding to an electronic apparatus which the user selected in a D/B and transmits to the user's mobile communication terminal (S47).

Subsequently, the server 12 determines that a user has finished an access to a site (S48). At this time, if the user has not finished an access, the server waits for another request for code information.

Meanwhile, in case that a user accesses a site through a remote controller having an Internet function, an Internet TV, or a PC not a mobile communication terminal, the aforementioned method for operation a remote controller information providing system is same.

Figure 5:
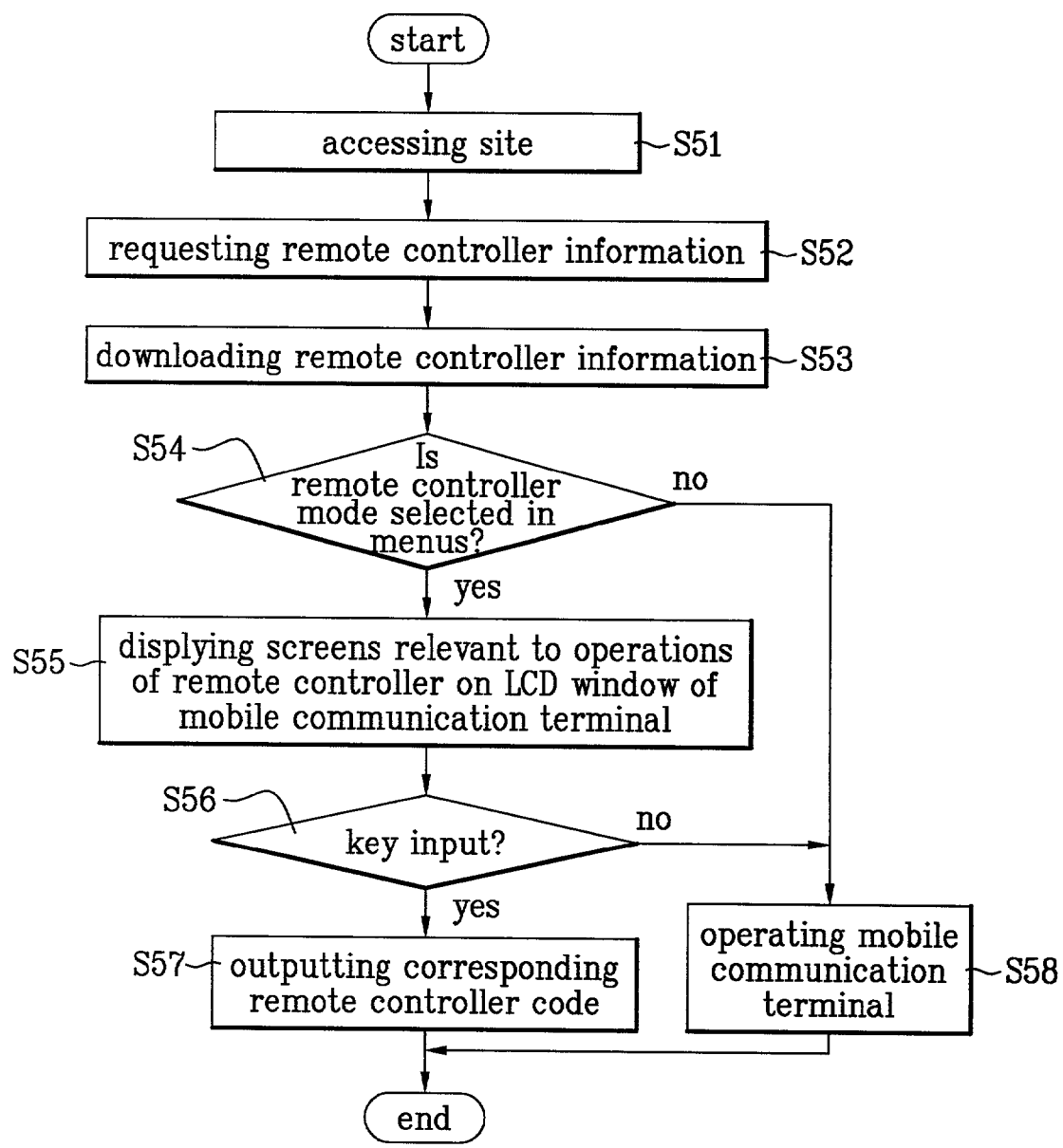
FIG. 5 illustrates a flow chart showing an operation of a union remote controller according to the present invention.

Hereinafter, an operation of a union remote controller (a mobile communication terminal, a remote controller having an Internet access function, a remote controller connected to an Internet TV or a PC) according to the present invention will be explained with reference to FIG. 5.

A user accesses an Internet site which provides the aforementioned remote controller information (code information and function information) by using a mobile communication terminal, a remote controller having an Internet access function, and a remote controller connected to an Internet TV or a PC (S51). At this time, in a remote controller connected to an Internet TV or a PC, an Internet access is impossible by a remote controller itself, thereby accessing an Internet site through an Internet TV or a PC connected to a remote controller.

Then, the remote controller information is required of the Internet site (S52), and downloads remote controller information transmitted from the Internet site (S53). Since the information request and downloading have already been described with reference to FIG. 4, their description will be omitted. Instead, in a remote controller connected to an Internet TV or a PC, it is required that a program for transmitting the remote controller information downloaded from the Internet site to an Internet TV or a PC to a remote controller should be installed. The program can be provided as a diskette type or a downloading type from a corresponding Internet site.

Accordingly, a user downloads remote controller information through an Internet TV or a PC, and transmits the controller information to a remote controller again by using the program. Otherwise, a user directly transmits the remote controller information to a remote controller through an Internet TV or a PC at the time of downloading.

Subsequently, if a user selects a remote controller mode among menus of a mobile communication terminal (S54), screens relevant to a remote controller operation, that is, screens of product lists corresponding to remote controller information which he or she has downloaded until now are displayed on a display window of a mobile communication terminal. Then, if the user selects one of the products shown on the list screen, various remote controller function keys of a corresponding product are displayed (S55).

Then, if a user selects his or her desired key among function keys displayed on the display window (S56), an infrared ray transmitting unit is operated in a controlling unit so as to generate an infrared ray signal having a code fit to the user, thereby a corresponding infrared signal is output (S57).

For example, in case that a user selects a TV remote controller mode of LG and selects a 'channel+' function among functions displayed on an LCD window by using up and down keys of a mobile communication terminal, the controlling unit reads a key code corresponding to a 'channel+' of a corresponding model TV of LG among the stored remote controller code information by using a preset application program, so that an infrared ray transmitting unit is operated and an infrared ray signal of a corresponding code is transmitted.

Accordingly, a corresponding electronic apparatus receives an infrared ray signal generated from the mobile communication terminal and decodes, thereby performing a corresponding operation.

In the meantime, if a user does not select a remote controller mode in menus of a mobile communication terminal or does not input a predetermined key on a menu, a general mobile communication terminal function is performed (S58).

The aforementioned operation of a union remote controller of a mobile communication terminal is equally applied between a remote controller having an Internet access function and a remote controller not having an Internet access function except an operation which selects a remote controller mode.

The union remote controller, the union remote controller information providing system and the method for using the same have the following advantages.

First, all kinds of electronic apparatuses can be remotely controlled regardless of manufacture companies and product models, etc. Also, products which will be on the market later can also be controlled through a simple Internet access and a downloading without any correction in hardware. Therefore, a separate remote controller for each product is riot required, and there is no temporal and economical inconvenience that may occur in maintaining a number of remote controllers.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A remote controller, comprising:
   a communication module configured to communicate over the Internet with a device, which is configured to operate an Internet site, wherein the communication module receives remote controller information for at least one of a plurality of electronic apparatuses over the Internet from the device, said remote controller information including remote controller code information and function information for a selected one of the plurality of electronic apparatuses;
   a storage device for storing the remote controller information transmitted through the communication module; and
   a display unit including an image process circuit and a display window, said display unit displaying various remote controller function keys and a list of the plurality of electronic apparatuses, wherein the list of the plurality of electronic apparatuses includes apparatuses from different manufacturers, different kinds of apparatuses or different models of apparatuses,
   wherein the remote controller transmits an infrared signal corresponding to a key input by a user, wherein the user selects an item from the displayed list of the plurality of electronic apparatuses and the communication module communicates with the device to receive the remote controller information corresponding to the selected item from the list.

2. The remote controller as claimed in claim 1, wherein the device comprises one of a server or a PC.

3. The remote controller of claim 1, further comprising:
   a user interface unit configured to receive user operation commands for remote controller functions.

4. The remote controller of claim 1, further comprising an infrared transmitting unit configured to generate at least one infrared signal corresponding to the key input by the user among the various remote controller function keys.

5. The remote controller of claim 4, further comprising a controlling unit configured to control at least the infrared transmitting unit.

6. The remote controller of claim 5, further comprising a program executable by the controlling unit to select and control each of the plurality of electronic apparatuses.

7. A remote controller, comprising:
   a communication device to communicate with a server or a computer over the Internet, the communication device to receive remote controller information for at least one of a plurality of electronic apparatuses over the Internet from the server or the computer, said remote controller information including remote controller code information and function information for a selected one of the plurality of electronic apparatuses;
   a storage device to store the remote controller information;
   a display unit including a display window to display various remote controller function keys and a list of the plurality of electronic apparatuses, wherein the list of the plurality of electronic apparatuses includes apparatuses from different manufacturers, different kinds of apparatuses or different models of apparatuses, wherein when the user selects an apparatus from the displayed list of the plurality of electronic apparatuses, the communication device communicates with the server or the computer to receive the remote controller information related to the selected apparatus; and
   a user interface unit configured to receive user operation commands for remote controller functions,
   wherein the remote controller transmits an infrared signal corresponding to a key input by a user for the selected apparatus.

8. The remote controller of claim 7, further comprising an infrared transmitting unit to generate the infrared signal corresponding to the key input by the user among the various remote controller function keys.

9. The remote controller of claim 8, further comprising a controlling unit to control at least the infrared transmitting unit.

10. The remote controller of claim 9, further comprising a program executable by the controlling unit to select and control each of the plurality of electronic apparatuses.

* * * * *